United States Patent
Macerola et al.

(10) Patent No.: US 8,614,923 B2
(45) Date of Patent: Dec. 24, 2013

(54) MEMORY CELL SENSING USING NEGATIVE VOLTAGE

(75) Inventors: Agostino Macerola, San Benedetto dei Marsi (IT); Giulio-Giuseppe Marotta, Contigliano (IT)

(73) Assignee: Micron Technology, Inc., Boise, ID (US)

( * ) Notice: Subject to any disclaimer, the term of this patent is extended or adjusted under 35 U.S.C. 154(b) by 1 day.

(21) Appl. No.: 13/426,075

(22) Filed: Mar. 21, 2012

(65) Prior Publication Data

US 2012/0176837 A1 Jul. 12, 2012

Related U.S. Application Data

(62) Division of application No. 12/251,779, filed on Oct. 15, 2008, now Pat. No. 8,144,525.

(30) Foreign Application Priority Data

Jul. 9, 2008 (IT) .............................. RM2008A0371

(51) Int. Cl.
*G11C 5/14* (2006.01)

(52) U.S. Cl.
USPC .................. 365/189.09; 365/189.15; 365/205

(58) Field of Classification Search
USPC .......... 365/189.07, 189.08, 189.09, 205, 207, 365/185.18, 185.21, 185.19, 185.25
See application file for complete search history.

(56) References Cited

U.S. PATENT DOCUMENTS

| | | | |
|---|---|---|---|
| 6,304,488 B1 | 10/2001 | Abedifard et al. | |
| 6,507,183 B1 | 1/2003 | Mulatti et al. | |
| 6,901,023 B2 | 5/2005 | Kirsch et al. | |
| 7,336,541 B2 | 2/2008 | Aritome | |
| 2005/0243602 A1 | 11/2005 | Umezawa | |
| 2006/0133150 A1 | 6/2006 | Shibata | |
| 2006/0245290 A1 | 11/2006 | Han et al. | |
| 2007/0014152 A1 | 1/2007 | Shibata et al. | |
| 2007/0133249 A1 | 6/2007 | Roohparvar | |
| 2007/0153574 A1 | 7/2007 | Kouno | |
| 2007/0159891 A1 | 7/2007 | Tu et al. | |
| 2008/0062760 A1 | 3/2008 | Kim | |
| 2008/0106941 A1 | 5/2008 | Cho | |
| 2008/0181001 A1 | 7/2008 | Shalvi | |
| 2008/0273395 A1 | 11/2008 | Sarin et al. | |
| 2009/0273984 A1 | 11/2009 | Tanzawa | |

FOREIGN PATENT DOCUMENTS

EP 1 729 306 A1 12/2006

OTHER PUBLICATIONS

European Patent Office, "Search Report and Written Opinion" for related Italian Patent Application No. RM2008A000371, filed Jul. 9, 2008, date mailed Mar. 12, 2009 (10 pp.).
International Search Report and Written Opinion for related PCT Application No. PCT/US2009/003659, mailed Feb. 18, 2010 (11 pp.).
Taiwanese Office Action and Search Report for Taiwan Patent Application No. 098122295, dated Aug. 13, 2013, 8 pgs.

*Primary Examiner* — Harry W Byrne
*Assistant Examiner* — Hien Nguyen
(74) *Attorney, Agent, or Firm* — Brooks, Cameron & Huebsch, PLLC

(57) ABSTRACT

Embodiments of the present disclosure provide methods, devices, modules, and systems for memory cell sensing using negative voltage. One method includes applying a negative read voltage to a selected access line of an array of memory cells, applying a pass voltage to a number of unselected access lines of the array, and sensing whether a cell coupled to the selected access line is in a conductive state in response to the applied negative read voltage.

20 Claims, 10 Drawing Sheets

US 8,614,923 B2

MEMORY CELL SENSING USING NEGATIVE VOLTAGE

PRIORITY INFORMATION

This application is a Divisional of U.S. patent application Ser. No. 12/251,779, filed Oct. 15, 2008, which claims priority to an Italian Patent Application Serial No. RM2008A000371, filed Jul. 9, 2008, the specification of which is incorporated by reference herein.

TECHNICAL FIELD

The present disclosure relates generally to semiconductor devices and, more particularly, to memory devices having memory cells.

BACKGROUND

Memory devices are typically provided as internal, semiconductor, integrated circuits in computers, personal digital assistants (PDAs), digital cameras, and cellular telephones, among various other electronic devices. There are many different types of memory including random-access memory (RAM), read only memory (ROM), dynamic random access memory (DRAM), synchronous dynamic random access memory (SDRAM), phase change random access memory (PCRAM), and flash memory, among others.

Flash memory devices are utilized as non-volatile memory for a wide range of electronic applications. Flash memory devices typically use a one-transistor memory cell that allows for high memory densities, high reliability, and low power consumption.

Two common types of flash memory array architectures are the "NAND" and "NOR" architectures, so called for the logical form in which the basic memory cell configuration of each is arranged. In the NOR array architecture, the floating gate memory cells of the memory array are typically arranged in a matrix. The control gates of each floating gate memory cell of the array matrix are typically coupled by rows to access lines, e.g., word lines, and their drains are coupled to data lines, e.g., bit lines. The NOR architecture floating gate memory array is accessed by a row decoder activating a row of floating gate memory cells (i.e., those cells whose control gates are commonly coupled) by selecting the access line coupled to (and, in some cases, forming) their gates. The row of selected memory cells then place their data values on the data lines (wherein the cells commonly coupled to a particular data line are referred to as a "column") by flowing different currents depending on if a particular cell is in a programmed state or an erased state.

A NAND array architecture arranges its array of floating gate memory cells in a matrix such that the control gates of each floating gate memory cell of the array are coupled by rows to access lines, e.g., word lines. However, each memory cell is not directly coupled to a data line, e.g., bit line, by its drain. Instead, the memory cells of the array are coupled together in series, source to drain, between a source line and a data line.

Flash memory cells can be programmed to a desired state. That is, electric charge can be placed on, or removed from, the floating gate of a memory cell to put the cell into any of a number of stored states. For example, a single level cell (SLC) can represent two states, e.g., a 1 or 0 state, such as to indicate a binary digit ("bit"). Flash memory multilevel memory cells, which can be referred to as multi-bit cells, or multi-state cells, can be programmed into more than two possible states, e.g., to store more than one bit of data per cell. MLCs allow the manufacture of higher density memories without increasing the number of memory cells since each cell can represent more than one bit. As an example, MLCs can have a number of program states and an erase state, e.g., a cell capable of representing four bits can have fifteen program states and an erase state, e.g., 1111, 0111, 0011, 1011, 1001, 0001, 0101, 1101, 1100, 0100, 1110, 1000, 1010, 0010, 0110, and 0000.

The state of a memory cell, e.g., the data stored in the cell, is determined by the threshold voltage (Vt) of the cell. A MLC includes multiple Vt distribution ranges within a programming window. The programming window represents the voltage range within which the Vts of the memory cells are electrically altered to represent the different logical states. As an example, a programming window can have a lowermost voltage of about $-4V$ and an uppermost voltage of about $4V$.

In MLCs, the memory density depends on the number Vt distributions within the programming window, but the Vt distributions must be sufficiently spaced apart so as to reduce the possibility of a higher voltage of one distribution overlapping a lower Vt of the next distribution, which can lead to data read errors. For a given programming window, an increase in the number of Vt distributions, e.g., program states, leads to an increase in the number of bits a cell can represent.

DETAILED DESCRIPTION

Embodiments of the present disclosure provide methods, devices, modules, and systems for memory cell sensing using negative voltage. One method includes applying a negative read voltage to a selected word line of an array of memory cells, applying a pass voltage to a number of unselected word lines of the array, and sensing whether a cell coupled to the selected word line is in a conductive state in response to the applied negative read voltage.

In one or more embodiments, the array can be a NAND array of non-volatile multilevel memory cells. In various embodiments, a read operation and/or a program verify operation performed on the array can include: associating a different logical state with each of a number of different threshold voltage (Vt) distributions, wherein at least two Vt distributions include negative Vt levels; applying a negative read voltage to a word line of a selected cell while applying a pass voltage to word lines of unselected cells; and sensing a current variation of the data line in response to the selected cell changing from a non-conducting state to a conducting state.

In one or more embodiments, a memory device can include: an array of multilevel memory cells; a negative series switch system coupled to a number of global word lines associated with the array and configured to provide a particular negative read voltage to a selected local word line associated with a selected block of cells; and a negative voltage generator configured to provide the particular negative voltage as an input to the negative series switch system.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

Figure 1:
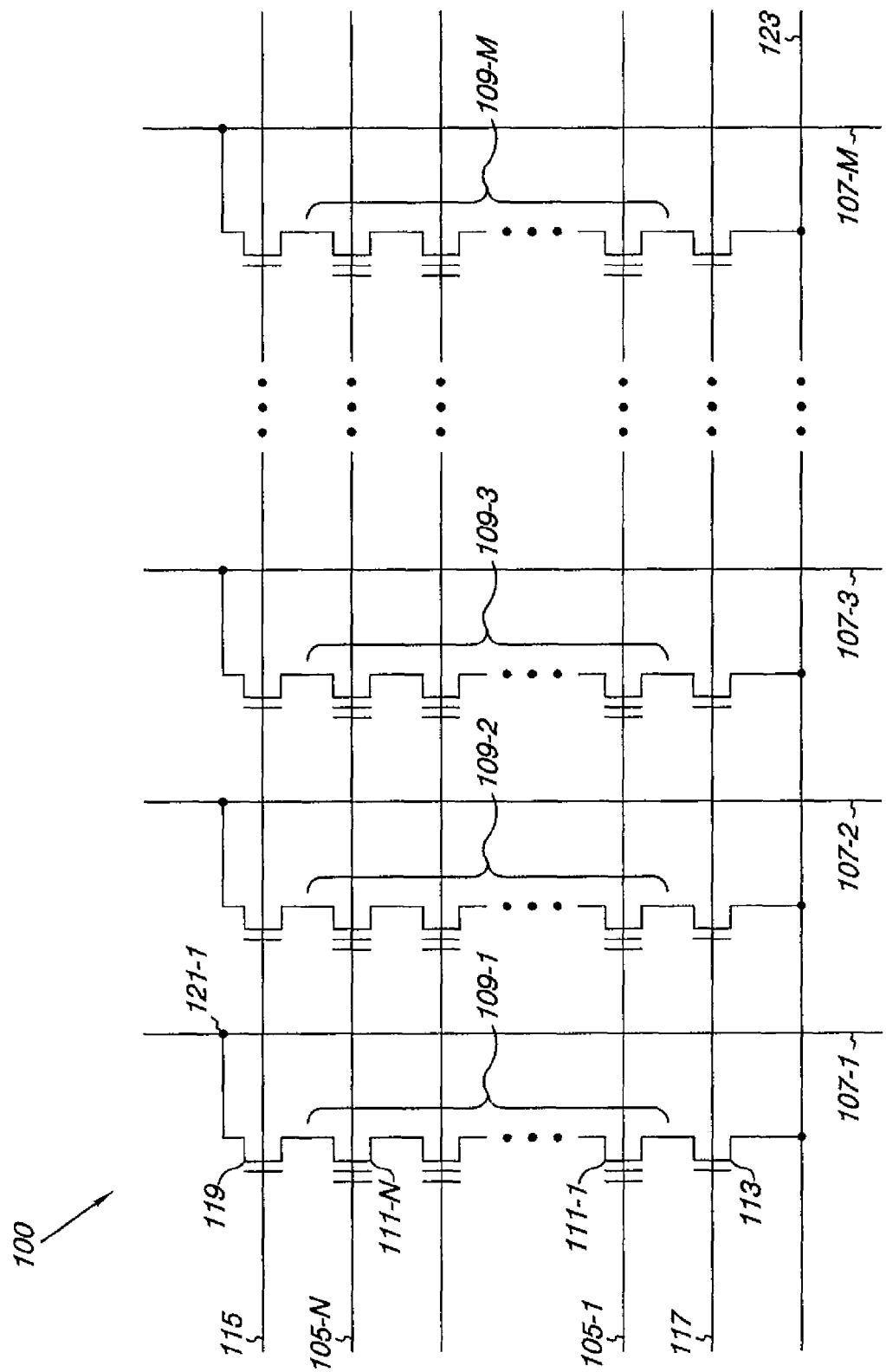
FIG. 1 is a schematic of a portion of a non-volatile memory array that can be used with one or more embodiments of the present disclosure.

FIG. 1 is a schematic of a portion of a non-volatile memory array 100 that can be used with one or more embodiments of the present disclosure. The embodiment illustrated in FIG. 1 is a NAND architecture non-volatile memory. However, embodiments described herein are not limited to this example.

As shown in the embodiment illustrated in FIG. 1, the memory array 100 includes access lines, e.g., word lines 105-1, ..., 105-N, and intersecting data lines, e.g., bit lines 107-1, ..., 107-M. The indicators "M" and "N" are used to indicate that the array 100 can include a number of word lines and a number of bit lines.

For ease of addressing in the digital environment, the number of word lines 105-1, ..., 105-N and the number of bit lines 107-1, ..., 107-M can each be some power of two, e.g., 32 word lines by 4,096 bit lines. Embodiments are not limited to a particular number of word lines and/or bit lines. One of ordinary skill in the art will appreciate that the bit lines 107-1, ..., 107-M can be coupled to sensing circuitry (not shown in FIG. 1) which can be used to determine the Vt level and/or state of a selected memory cell based on sensed current and/or voltage levels.

Memory array 100 includes NAND strings 109-1, 109-2, 109-3, ..., 109-M. Each NAND string includes non-volatile memory cells 111-1, ..., 111-N, each located at an intersection of a word line 105-1, ..., 105-N and a local bit line 107-1, 107-2, 107-3, ..., 107-M. The non-volatile memory cells 111-1, ..., 111-N of each NAND string 109-1, 109-2, 109-3, ..., 109-M are connected in series, source to drain between a select gate source (SGS) transistor, e.g., a field-effect transistor (FET) 113, and a select gate drain (SGD) transistor, e.g., FET 119. source select gate 113 is located at the intersection of a local bit line 107-1 and a source select line 117, while drain select gate 119 is located at the intersection of a local bit line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In one or more embodiments, construction of non-volatile memory cells 111-1, ..., 111-N includes a source, a drain, a floating gate or other charge storage node, and a control gate. Non-volatile memory cells, 111-1, ..., 111-N, have their control gates coupled to an associated word line, 105-1, ..., 105-N, respectively. Thus, a row of the non-volatile memory cells are commonly coupled to a given word line, e.g., 105-1, ..., 105-N. A column of the non-volatile memory cells 111-1, ..., 111-N make up the NAND strings, e.g., 109-1, 109-2, 109-3, ..., 109-M, coupled to a given local bit line, e.g., 107-1, 107-2, 107-3, ..., 107-M, respectively. A NOR array architecture would be similarly laid out with the exception that the string of memory cells would be coupled in parallel between the select gates.

The array 100 shown in FIG. 1 can represent a block of memory cells. A block of memory cells can refer to a number of memory cells that are erased together as a group. As one of ordinary skill in the art will appreciate, a memory array can include a number of blocks of memory cells, e.g., blocks 202-0, 202-1, and 202-3 shown in FIG. 2B.

As will be described further below in connection with subsequent figures, in various embodiments of the present disclosure, negative voltages can be applied to one or more word lines of a memory array during a sensing operation, e.g., during a read operation or a program verify operation, for instance. In such embodiments, using negative voltage can expand the programming window associated with the array, which can lead to increased memory density and increased data reliability, among other benefits.

Figure 2A:
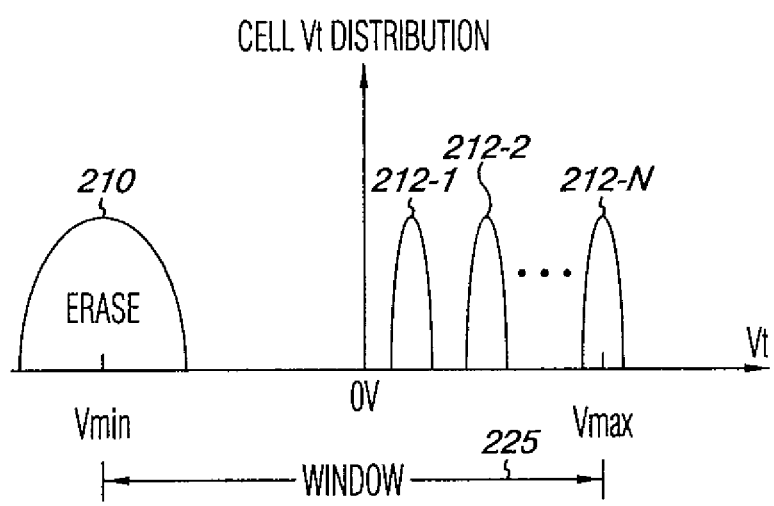
FIG. 2A illustrates a diagram of memory cell Vt distributions according to the prior art.

FIG. 2A illustrates a diagram of memory cell threshold voltage (Vt) distributions according to the prior art. FIG. 2A illustrates a number of Vt distributions 210, 212-1, 212-2, ..., 212-N within a programming window 225. The programming window 225 represents a range of voltage levels, e.g., a lowermost potential (Vmin) to an uppermost potential (Vmax), to which the Vts of the memory cells can be electrically altered in order to represent a number of different states. As an example Vmin can be about −4V and Vmax can be about 4V. Embodiments of the present disclosure are not limited to a particular programming window 225. For instance, as one of ordinary skill in the art will appreciate, the programming window 225, e.g., Vmin and Vmax values, can vary based on design and/or reliability considerations, among various other factors.

In FIG. 2A, the Vt distribution 210 represents an erased state and Vt distributions 212-1 to 212-N represent a number of programmed states. As illustrated, each of the programmed states 212-1 to 212-N are positive programmed states. As used herein, a positive programmed state refers to a Vt distribution, e.g., 212-1 to 212-N, which corresponds to a range of positive memory cell Vt levels associated with a particular logical program state, e.g., a binary data state such as "01," "1110," etc. As one of ordinary skill in the art will appreciate, each of the Vt distributions 210, 212-1, 212-2, ..., 212-N, can represent a particular logical data state. That is, the erase Vt distribution 210 and each of the program Vt distributions 210-1, 210-2, ..., 210-N can represent different logical data values.

As illustrated in FIG. 2A, in various prior approaches, the erase Vt distribution 210 includes negative Vt levels, and the program Vt distributions 212-1, 212-2, ..., 212-N include only positive Vt levels. That is, such previous approaches do not include negative programmed states, e.g., Vt distributions corresponding to a range of negative memory cell Vt levels associated with particular logical program states. As such, various previous approaches fail to utilize the programming window, e.g., window 225, in an efficient manner. One example of a previous approach for sensing memory cells without using negative voltage is described in co-pending, co-assigned U.S. patent application Ser. No. 11/799,657, entitled, "Expanded Programming Window For Non-Volatile Multilevel Memory Cells", filed on May 2, 2007.

As one of ordinary skill in the art will appreciate, and as described further herein, the particular program state of a selected cell can be determined, e.g., sensed via a read or program verify operation, by applying different read voltages to a selected word line until the gate-to-source voltage of the selected cell changes such that the selected cell switches from a non-conducting state to a conducting state. A pass voltage, which makes the unselected memory cells electrically conductive, can be supplied to the unselected word lines. A ground potential, e.g., 0V, can be applied to the common source line, e.g., S/L, and to the semiconductor substrate, e.g., P-well or N-well region, in which the selected cell is formed.

Figure 2B:
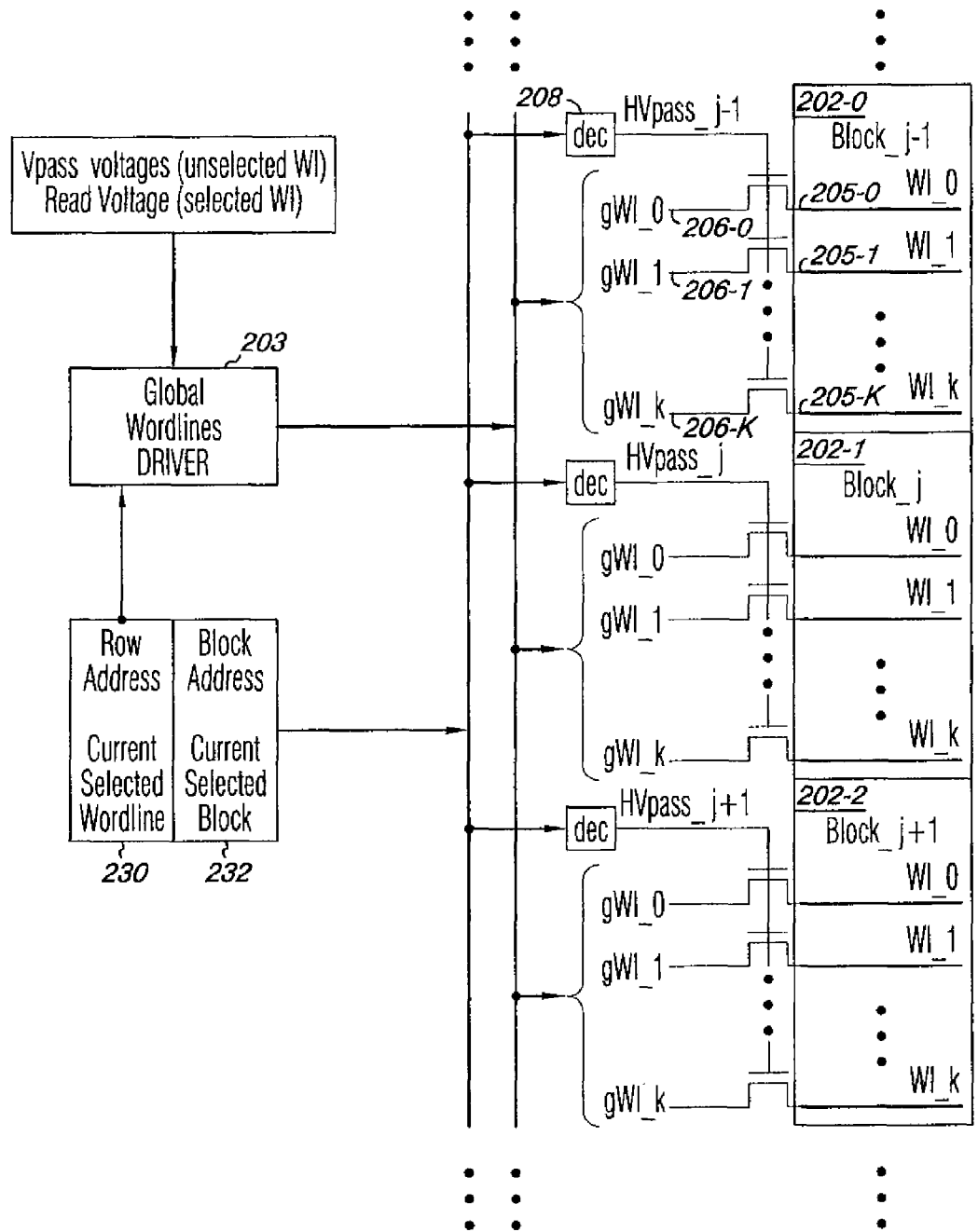
FIG. 2B illustrates a diagram of circuitry used to perform read and/or program verify operations according to the prior art.

An example of circuitry used to perform read and/or program verify operations according to the prior art is illustrated in FIG. 2B. That is, FIG. 2B illustrates circuitry used to determine the Vt levels of cells programmed to within the Vt distributions 210, 212-1, 212-2, ..., 212-N shown in FIG. 2A. For instance, the diagram shown in FIG. 2B includes circuitry used to determine the Vt level of one or more selected memory cells, e.g. one or more selected memory cells in an array such as array 100 illustrated in FIG. 1. The circuitry shown in the example illustrated in FIG. 2B includes an example portion of a NAND flash memory.

The diagram illustrated in FIG. 2B includes a number of blocks of memory cells 202-0 (Block_j−1), 202-1 (Block j), and 202-2 (Block_j+1). In the example illustrated in FIG. 2B, each of the blocks 202-0, 202-1, and 202-2 include a number of local word lines 205-0 (Wl_0), 205-1 (Wl_1), ..., 205-$k$ (Wl_k) having memory cells coupled thereto. Each of the local word lines 205-0, 205-1, ..., 205-$k$ of each block 202-0, 202-1, and 202-2 can be selectively coupled to one of a corresponding number of global word lines 206-0 (gWl_0), 206-1 (gWl_1), ..., 206-$k$ (gWl_k) via a driver transistor.

During operation, a decoder 208 associated with each of the blocks 202-0, 202-1, and 202-2 can be used to couple the global word lines 206-0, 206-1, ..., 206-$k$ to the local word lines 205-0, 205-1, ..., 205-$k$ of a selected block based on a selected block address 232. For instance, if block 202-1 is the selected block, then the output of the decoder 208 associated with block 202-1 applies a voltage (HVpass_j) to the gates of the driver transistors associated with block 202-1 in order to couple the local word lines of the selected block, e.g., block 202-1, to the global word lines, e.g., 206-0, 206-1, ..., 206-$k$.

As illustrated in FIG. 2B, a global word line driver 203 is coupled to each of the global word lines 206-0, 206-1, ..., 206-$k$. As such, the global word line driver 203 can be used to provide voltage signals to each of the local word lines 205-0, 205-1, ..., 205-$k$ of a selected block, e.g., a selected block of blocks 202-0, 202-1, and 202-2.

As an example, in a sensing operation such as a read or a program verify operation, the global word line driver 203 can provide a read voltage to a selected word line of a selected block, e.g., based on a received row address 230, and a pass voltage to the unselected word lines of the selected block via the appropriate corresponding global word lines. The pass voltage places each of the unselected cells in a conducting state, and the selected cell will be in a conducting or non-conducting state in response to the applied read voltage. Sensing circuitry, e.g., sense amplifiers (not shown in FIG. 2B), can then be used to detect when the selected cell changes from the electrically non-conducting state to the electrically conducting state. For example, a sense amplifier can detect a current or voltage variation on the bit line, e.g., bit line 107-1 shown in FIG. 1, when the selected cell becomes electrically conductive, e.g., when the Vgs of the selected cell switches from a value less than the Vt of the selected cell to a value greater than the Vt of the selected cell in response to a particular read voltage applied to the selected word line.

However, prior circuitry such as that illustrated in FIG. 2B is not configured to provide negative voltages to selected or unselected word lines. That is, in various previous approaches, the global word line driver, e.g. driver 203, is configured to provide only positive voltages to the local word lines 205-0, 205-1, ..., 205-$k$ of the selected block via the corresponding global word lines 206-0, 206-1, ..., 206-$k$. Such previous approaches to performing read and program verify operations do not include circuitry configured to provide negative voltages to the word lines.

As such, various previous approaches do not provide an adequate way to perform read and program verify operations on memory cells which are programmed to negative programmed states as well as memory cells which are programmed to positive programmed states. For example, in order to determine the Vt of a selected cell, which has a negative Vt, a negative voltage would need to be applied to the selected word line. For instance, when the Vt of the selected cell is a negative value, the gate-to-source voltage (Vgs) of the selected cell is greater than the Vt of the cell for each applied positive read voltage. That is, the selected cell is in the conducting state, e.g., Vgs greater than the Vt of the selected cell, for each applied read voltage. As such, the selected cell is always in a conducting state for the read and/or verify operation so a transition from the non-conducting to the conducting state can not be determined.

The inability to perform read and/or program verify operations on memory cells programmed to negative programmed states ineffectively utilizes the programming window, e.g., window 225 shown in FIG. 2A. Such ineffective use of the programming window reduces the effective program window size, which can lead to a reduced memory density and can reduce data read reliability by decreasing the ability to distinguish between adjacent programmed states, among other drawbacks.

Figure 3A:
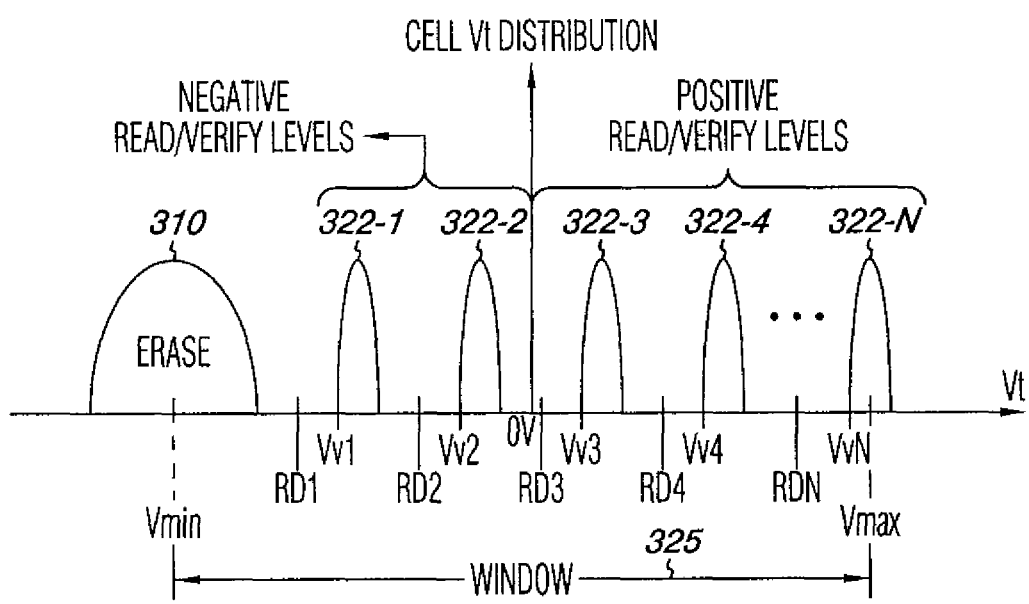
FIG. 3A illustrates a diagram of memory cell Vt distributions according to an embodiment of the present disclosure.

FIG. 3A illustrates a diagram of memory cell Vt distributions according to an embodiment of the present disclosure. FIG. 3A illustrates a number of Vt distributions 310, 322-1, 322-2, 322-3, 322-4, ..., 322-N within a programming window 325. The programming window 325 represents a range of voltage levels, e.g., Vmin to Vmax, to which the Vts of the memory cells can be electrically altered in order to represent a number of different states. As an example Vmin can be about −4V and Vmax can be about 4V. The programming window 325, e.g., Vmin and Vmax values, can vary based on design and/or reliability considerations, among various other factors. As used in FIGS. 3A and 3B, Vmin represents an erased Vt level and Vmax represents an uppermost positive programmed Vt level.

In FIG. 3A, the Vt distribution 310 represents an erased state or an erased level and Vt distributions 322-1 to 322-N represent a number of programmed states or programmed levels. As illustrated, the number of programmed states 322-1 to 322-N include both positive programmed states, e.g., 322-3, 322-4, . . . , 322-N, and negative programmed states, e.g., 322-1 and 322-2. As used herein, a negative programmed state refers to a Vt distribution, e.g., 322-1 to 322-N, which corresponds to a range of negative memory cell Vt levels associated with a particular logic state, e.g., a binary data state such as "01," "1110," etc. Embodiments are not limited to a particular number of positive and/or negative programmed states. For instance, although FIG. 3A illustrates two negative programmed states 322-1 and 322-2, various embodiments can include more or fewer than two negative programmed states.

In operation, memory cells such as those illustrated in the array 100 shown in FIG. 1 can be simultaneously erased. That is their Vt levels can be brought to an erase Vt level within the erase Vt distribution 310. The Vts of the memory cells can then be increased, e.g., programmed, from out of the erase Vt distribution 310 to within one of the program Vt distributions 322-1 to 322-N. As one of ordinary skill in the art will appreciate, programming the cells from out of the erase distribution 310 into a different distribution 322-1 to 322-N can include applying a number of programming pulses to a selected word line e.g., 205-0 to 205-$k$ shown in FIG. 2B.

In the embodiment illustrated in FIG. 3A, each program Vt distribution 322-1, 322-2, 322-3, 322-4, . . . , 322-N has a corresponding verify voltage Vv1, Vv2, Vv3, Vv4, . . . , VvN and a corresponding read voltage RD1, RD2, RD3, RD4, . . . , RDN. A read voltage may also be referred to herein as a read reference voltage. For memory cells to be programmed into Vt distribution 322-1 from erase distribution 310, the application of programming pulses is terminated when their Vt become equal to or greater than the verify level Vv1. Similarly, for cells to be programmed into one of the other Vt distributions 322-2 to 322-N, the application of programming pulses is terminated when their Vt become equal to or greater than the respective verify level Vv2 to VvN.

As one of ordinary skill in the art will appreciate, a program verify operation can be performed after each programming pulse to determine whether the Vt of selected cells have reached the appropriate verify voltage, e.g., Vv1 to VvN, corresponding to the desired program state, e.g., Vt distribution 322-1 to 322-N. As described further below, during a program verify operation, circuitry such as that illustrated in FIG. 3B can be used to determine the Vt of cells having positive Vt levels and of cells having negative Vt levels during program verify operations.

In various embodiments, and as illustrated in FIG. 3A, the individual program verify levels Vv1 to VvN are coincident with the lower margins of their respective distribution ranges 322-1 to 322-N. However, as one of ordinary skill in the art will appreciate, the program verify levels can be less than the lower margins in some cases.

The embodiment shown in FIG. 3A also illustrates the read voltages RD1, RD2, RD3, RD4, . . . , RDN used to determine into which of the program Vt distributions 322-1, 322-2, 322-3, 322-4, . . . , 322-N a cell has been programmed. The read voltage levels RD1 to RDN are reference voltages used to read the respective program states of the cells, e.g., "01", "011", 0110, etc.

During a read operation, the read voltages RD1 to RDN are the voltage levels with which the Vt of a memory cell being read is compared. In various embodiments, the read reference voltages RD1 to RDN can be positioned roughly halfway between adjacent Vt distribution ranges 322-1 to 322-N. As an example, RD1 may be about −3.0V, RD2 may be about −2.5V, RD3 may be about 0.2V, RD4 may be about 0.7V, and RDN may be about 3.2V. Also, the program verify voltages Vv1, Vv2, Vv3, Vv4, and VvN associated with the read voltages RD1, RD2, RD3, RD4, and RDN, respectively, may have respective voltages of about −2.8V, −2.2V, 0.5V, 1.1V, and 3.5V. Embodiments are not limited to particular program verify voltages and/or particular read voltages.

Figure 3B:
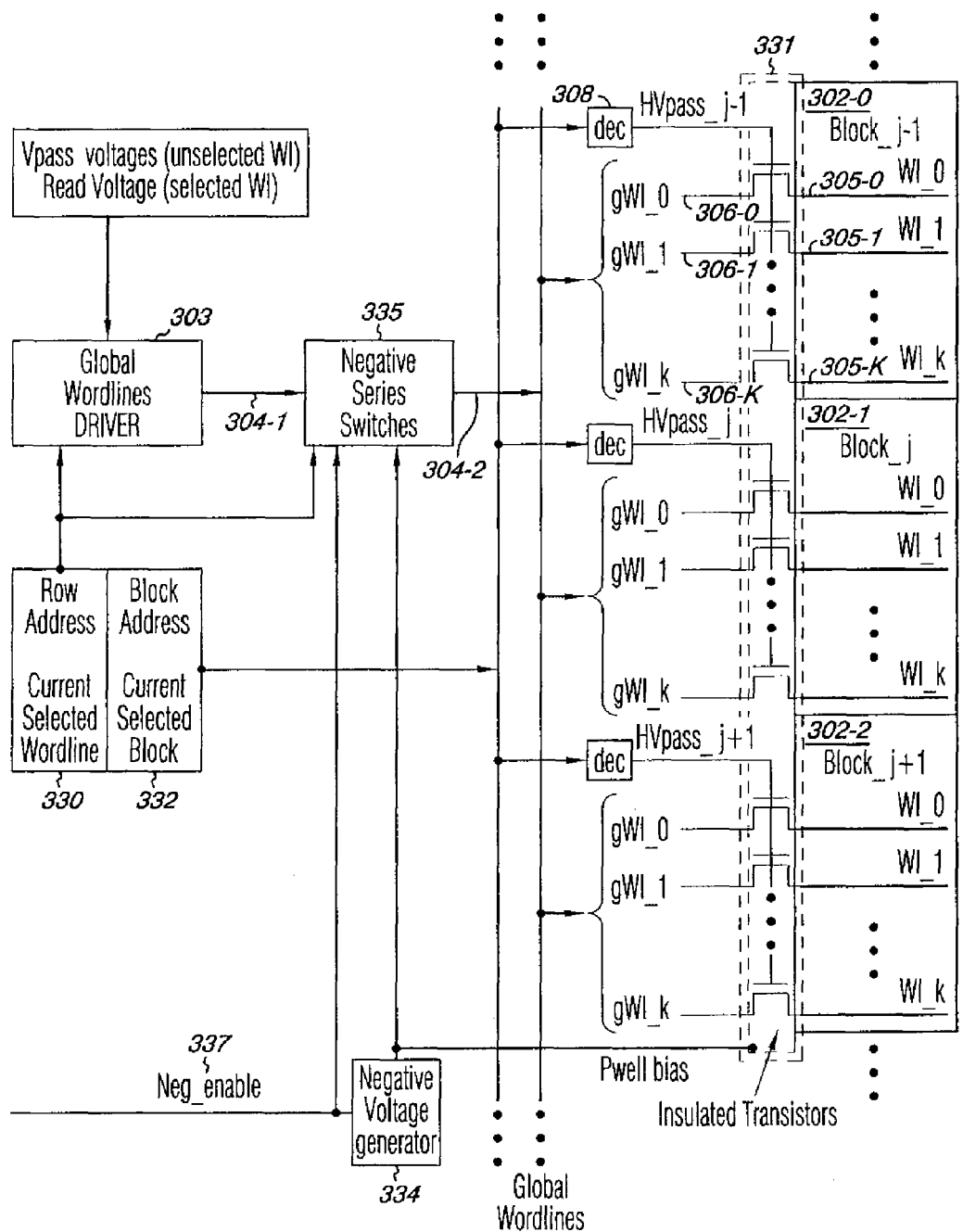
FIG. 3B illustrates a diagram of circuitry used to perform read and/or program verify operations in accordance with one or more embodiments of the present disclosure.

As one of ordinary skill in the art will appreciate, and as described further herein, the particular program state of a selected cell can be determined, e.g., sensed via a read or program verify operation, by applying different read voltages to a selected word line until the gate-to-source voltage of the selected cell changes such that the selected cell switches from a non-conducting state to a conducting state. A pass voltage, which makes the unselected memory cells electrically conductive, can be supplied to the unselected word lines. An example of circuitry used to perform read and/or program verify operations according to one or more embodiments of the present disclosure is illustrated in FIG. 3B. That is, FIG. 3B illustrates circuitry used to determine the Vt levels of cells programmed to within the Vt distributions 310 and 322-1 to 322-N shown in FIG. 3A.

For instance, the diagram shown in FIG. 3B includes circuitry used to determine the Vt level of one or more selected memory cells, e.g. one or more selected memory cells in an array such as array 100 illustrated in FIG. 1. That is, FIG. 3B illustrates a diagram of circuitry used to perform read and/or program verify operations in accordance with one or more embodiments of the present disclosure. The circuitry shown in the example illustrated in FIG. 3B includes a simplified portion of a NAND flash memory.

The diagram illustrated in FIG. 3B includes a number of blocks of memory cells 302-0 (Block_j−1), 302-1 (Blockj), and 302-2 (Block_j+1). In the example illustrated in FIG. 3B, each of the blocks 302-0, 302-1, and 302-2 include a number of local word lines 305-0 (Wl_0), 305-1 (Wl_1), . . . , 305-$k$ (Wl_k) having memory cells coupled thereto. The memory cells can be non-volatile floating gate memory cells such as those described in connection with FIG. 1.

In the embodiment illustrated in FIG. 3B, each of the local word lines 305-0, 305-1, . . . , 305-$k$ of each block 302-0, 302-1, and 302-2 can be selectively coupled to one of a corresponding number of global word lines 306-0 (gWl_0), 306-1 (gWl_1), . . . , 306-$k$ (gWl_k) via a driver transistor of a bank 331 of string drive transistors. In one or more embodiments, and as shown in FIG. 3B, the string drive transistors of bank 331 are insulated n-channel transistors.

During operation, a decoder 308 associated with each of the blocks 302-0, 302-1, and 302-2 can be used to couple the global word lines 306-0, 306-1, . . . , 306-$k$ to the local word lines 305-0, 305-1, . . . , 305-$k$ of a selected block based on a selected block address 332. For instance, if block 302-1 is the selected block, then the output of the decoder 308 associated with block 302-1 applies a voltage (HVpass_j) to the gates of the driver transistors associated with block 302-1 in order to couple the local word lines of the selected block, e.g., block 302-1, to the global word lines, e.g., 306-0, 306-1, . . . , 306-$k$.

Unlike in the circuitry illustrated in FIG. 2B, in which the global word lines are directly coupled to a global word line driver, in the embodiment illustrated in FIG. 3B, the global word lines 306-0, 306-1, . . . , 306-$k$ are coupled to the global word line driver 303 via a negative series switch system 335. A more detailed description of a negative series switch system in accordance with embodiments of the present disclosure is provided below in connection with FIG. 4.

In the embodiment illustrated in FIG. 3B, arrow 304-1 represents the number of global word lines 306-0, 306-1, . . . , 306-k, which are input to the negative series switch system 335. The arrow 304-2 represents the number of global word lines 306-0, 306-1, . . . , 306-k, which are output from the negative series switch system 335 and can be selectively coupled to the local word lines 305-0, 305-1, . . . , 305-k of a selected block, e.g., 302-0, 302-1, . . . , 302-2.

In various embodiments, and as described further below, the negative series switch system 335 can be used to connect a selected local word line, e.g., 305-0, 305-1, . . . , 305-k, to a negative read voltage to perform a sensing operation such as a read and/or program verify operation. The embodiment illustrated in FIG. 3B includes a negative voltage generator 334 that provides an input, e.g., a programmable negative voltage, to the negative series switch system 335. An example of a negative voltage generator in accordance with embodiments of the present disclosure is described in detail below in connection with FIG. 6.

In operation, the global word line driver 303 is coupled to, and provides voltage signals to, the global word lines 304-1. As described further below, the negative voltage provided by the generator 334 to the negative series switch system 335 is applied to a selected local word line, e.g., via the selected one of the global word lines 304-2, based on the row address 330 of the selected word line and based on the status of an enable signal (Neg_enable) 337. As such, the embodiment illustrated in FIG. 3B can provide either a negative read voltage to a selected local word line or a positive read voltage to a selected local word line in order to determine the Vt levels of cells having negative programmed states and positive programmed states.

In one or more embodiments, and as illustrated in FIG. 3B, the negative voltage generator 334 provides a "Pwell bias" signal to the local p-well region of the bank 331 of string driver transistors. The Pwell bias signal is higher in magnitude than the negative voltage provided by the generator 334 to the switch system 335 so as to prevent junction forward biasing.

As an example, in a sensing operation such as a read or a program verify operation, the global word line driver 303 can provide positive voltage signals to the global word lines 304-1 input to the negative series switch system 335. The unselected global word lines, e.g., the word lines not having cells being read or verified, are provided with a pass voltage (Vpass), while the selected global word line, e.g., as indicated by address 330, is provided with a positive read voltage.

If the enable signal (Neg_enable) 337 is low, then the negative switch series system 335 simply connects each of the global word lines 304-1 with the corresponding ones of global word lines 304-2. When Neg_enable 337 is high, the unselected word lines of global word lines 304-1 are connected to the corresponding ones of global word lines 304-2; however, the selected word line of global word lines 304-1 is connected to the output of the negative voltage generator 334, e.g., to a negative read voltage. In this manner, the embodiment illustrated in FIG. 3B can be used to apply negative read voltages to selected local word lines, e.g., 305-0, 305-1, . . . , 305-k, of a selected block, e.g., 302-0, 302-1, . . . , 302-2, in order to determine the Vt level of a memory cell programmed to a negative programmed state. That is, the embodiment illustrated in FIG. 3B can be used to read and/or verify memory cells having either positive or negative Vt levels.

Figure 4:
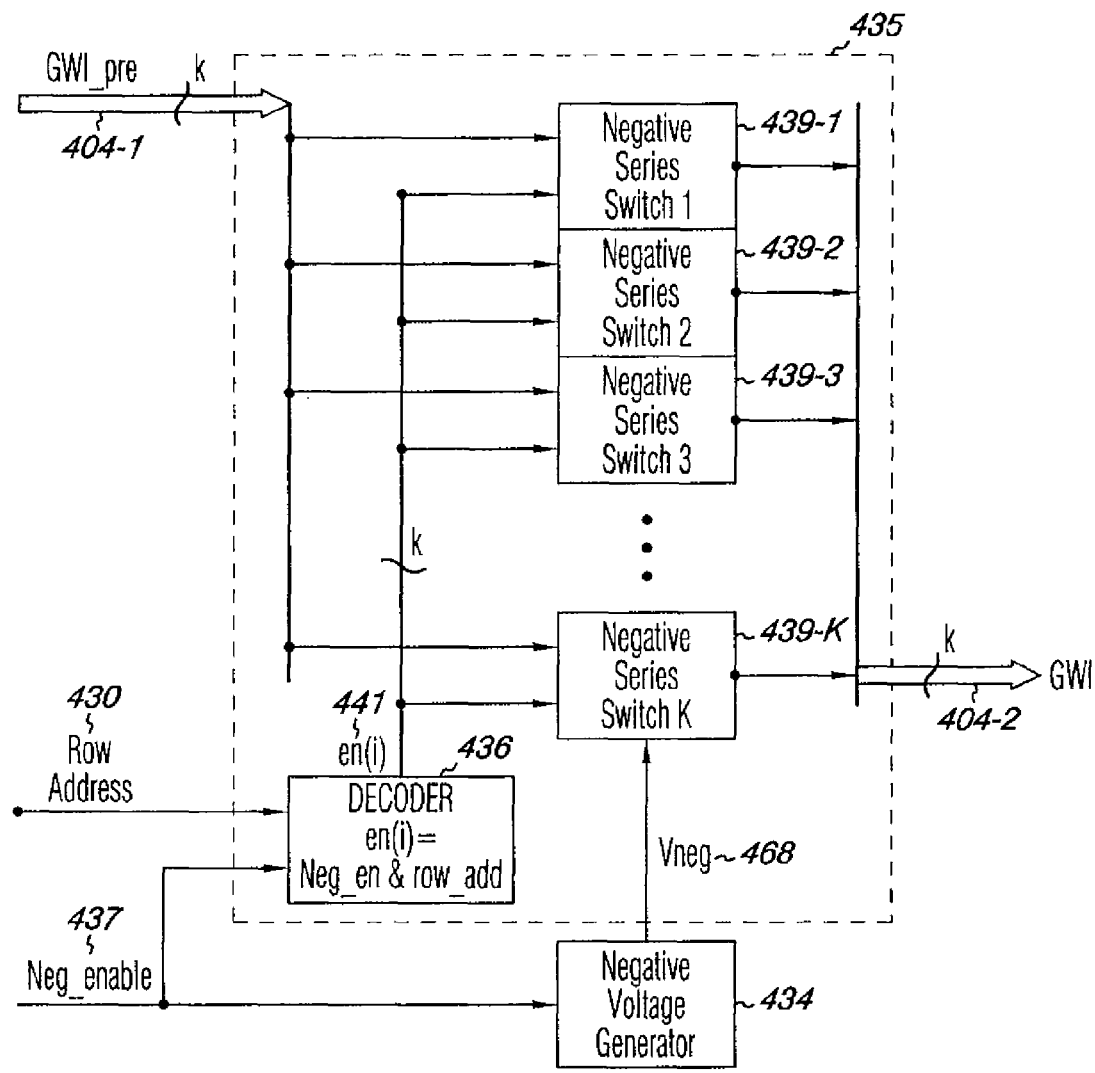
FIG. 4 illustrates a diagram of a negative series switch system in accordance with an embodiment of the present disclosure.

FIG. 4 illustrates a diagram of a negative series switch system 435 in accordance with an embodiment of the present disclosure. The switch system 435 can be a negative series switch system such as the switch system 335 described in above in connection with FIG. 3B.

In one or more embodiments, and as illustrated in FIG. 4, the negative series switch system 435 can include a number of negative series switches 439-1, 439-2, 439-3, . . . , 439-K configured to receive one of a number of global word lines 404-1 as an input. The number of global word lines 404-1 can be referred to herein as "input global word lines", e.g., GWl_pre as shown in FIG. 4. The number of global word lines, e.g., "k" in this example, corresponds to the number of local word lines associated with a block of memory cells in an array. An output of each of the negative series switches 439-1, 439-2, 439-3, . . . , 439-K is also coupled to a corresponding one of a corresponding number of global word lines 404-2. The number of global word lines 404-2 can be referred to herein as "output global word lines", e.g., GWl as shown in FIG. 4. The output global word lines 404-2 can be selectively coupled to the local word lines of a selected block of memory cells via a number of drive transistors as described above in connection with FIG. 3B.

In various embodiments, and as illustrated in FIG. 4, the negative series switch system 435 can include a decoder 436 that receives a row address 430 and an enable signal (Neg_enable) 437 as inputs. In operation, the decoder 436 can provide an enable signal en(i) 441 to each of the negative series switches 439-1, 439-2, 439-3, . . . , 439-K based on the received row address signal 430 and the status of the Neg_enable signal 437. The row address signal 430 can indicate the address of a selected local word line, e.g., a word line on which a read or verify operation is to be performed.

As an example, if the signal en(i) 441 received to a particular negative series switch is low, e.g., logic "0", then the particular negative series switch will connect the corresponding input global word line 404-1 to the corresponding output global word line 404-2. As such, a voltage signal provided by a word line driver, e.g., driver 303 shown in FIG. 3B, to an input global word line 404-1, is provided to the corresponding output global word line 404-2 through the corresponding negative series switch.

However, if the signal en(i) 441 received to a particular negative series switch is high, e.g., logic "1", then a negative voltage signal, e.g., Vneg 468, provided by a negative voltage generator 434 is applied to the corresponding output global word line 404-2 via the particular negative series switch. In operation, only the selected output global word line 404-2, e.g., as determined by the row address signal 430, is connected to Vneg 468, e.g., the output of the negative voltage generator 434. That is, unselected ones of the output global word lines 404-2 remain connected to the corresponding ones of the input global word lines 404-1. As such, the negative series switch system 435 can selectively apply a negative voltage, e.g., a negative read voltage or a negative program verify voltage, to a selected local word line of a selected block of memory cells to perform a sensing operation, e.g., a read or program verify operation.

Figure 5:
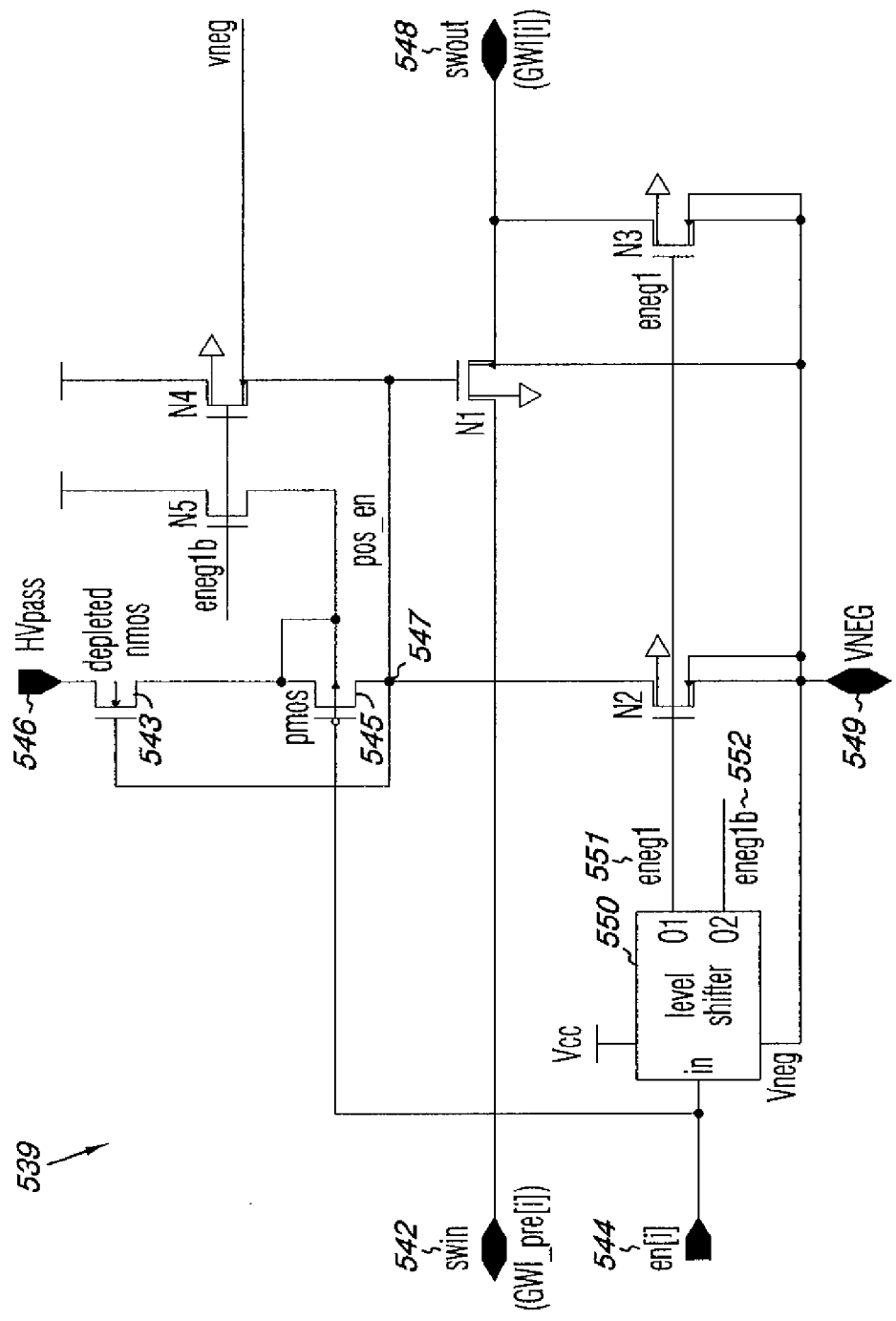
FIG. 5 illustrates a diagram of a negative series switch in accordance with an embodiment of the present disclosure.

FIG. 5 illustrates a diagram of a negative series switch 539 in accordance with one or more embodiments of the present disclosure. The negative series switch 539 can be a switch such as negative series switches 439-1, 439-2, 439-3, . . . , 439-K shown in FIG. 4. That is, the negative series switch 539 can be a component of a negative series switch system embodiment of the present disclosure.

In the embodiment illustrated in FIG. 5, the negative series switch circuit 539 includes an input 542 (swin) and an output 548 (swout). The input 542 is coupled to an input global word line, e.g., GWl_pre 404-1 shown in FIG. 4, and the output 548 is coupled to an output global word line, e.g., GWl 404-2 shown in FIG. 4.

In this embodiment, the negative series switch 539 includes a level shifter 550 which receives an enable input signal 544 (en[i]). The level shifter 550 also receives, as inputs, a negative input voltage signal Vneg as well as a power supply input voltage signal Vcc. In the embodiment illustrated in FIG. 5, the level shifter 550 includes as a first output (O_1) an output voltage signal 551 (eneg1) and as a second output (O_2) an output voltage signal 552 (eneg1b).

In the embodiment illustrated in FIG. 5, the negative series switch 539 includes an input 546 (HVpass) providing a voltage higher than an uppermost read voltage associated with performing a read and/or program verify operation on an array of memory cells. In some embodiments, the HVpass voltage can be about 6-7V. The negative series switch 539 also includes an input 549 (VNEG) providing a voltage signal Vneg.

In various embodiments, the negative series switch, e.g., 539, can include a number of transistors used as switching elements. For instance, in this embodiment, the negative series switch 539 include a depleted nmos transistor 543 coupled to a pmos transistor 545 with a gate of the transistor 543 coupled to a source/drain region of transistor 545 at node 547 (shown as "pos_en"). The source/drain region of transistor 545, which is not connected to node 547, is connected to a source/drain region of the depleted nmos transistor 543. The gate of the pmos transistor 545 is coupled to the enable signal 544 (en[i]) such that the transistor 545 is "on" when the enable signal 544 is low and is "off" when the enable signal 544 is high. The negative series switch 539 also includes a number of nmos transistors N1, N2, N3, N4, and N5.

During operation, if the enable signal 544 is low, e.g., logic "0", then the output voltage signal 551 (eneg1) of the level shifter 550 is equal to the voltage signal Vneg, and the output voltage signal 552 (eneg1b) is equal to Vcc, e.g., logic "1". If the enable signal 544 is high, then the output voltage signal 551 is equal to Vcc and the output voltage signal 552 is equal to the voltage signal Vneg. The voltage signal Vneg is 0V during memory array operations in which a negative voltage is not used. However, during memory array operations in which a negative voltage is used, e.g., sensing operation such as a read or a program verify operation in which a negative voltage may be used to determine the Vt of a cell, then the voltage signal Vneg is equal to the target negative voltage. The target negative voltage can refer to a voltage such as a negative read voltage to be applied to a selected local word line.

If the enable signal 544 is low, such that the output voltage signal 552 (eneg1b) is high, then the transistors N4 and N5 are turned on since their gates are coupled to eneg1b as shown. The pmos transistor is also turned on due to the low enable signal 544. As such, the voltage at node 547 (pos_en) is equal to HVpass. Therefore, transistor N1 is turned on such that the path between input 542 (swin) and output 548 (swout) is closed, e.g., the voltage on the input global word line (GWl_pre[i]) is equal to the voltage on the corresponding output global word line (GWl[i]).

If the enable signal 544 is high, such that the output voltage signal 551 is high (and the output voltage signal 552 is low), then the transistors N2 and N3 are turned on and the transistors N4, N5, and 545 are turned off In this case, the voltage signal Vneg is provided at node 547 (pos_en), such that transistor N1 is turned off, e.g., the path between input 542 (swin) and output 548 (swout) is open. Furthermore, since transistor N3 is turned on, the voltage signal Vneg provided from input 549 (VNEG) is also provided at the output 548 (swout).

As such, a target negative voltage, e.g., Vneg, can be applied to the output 548 (swout), e.g., to a selected output global word line (Gwl[i]), while the input 542 (swin), e.g., a corresponding input global word line (GWl_pre[i]), is insulated from the negative voltage signal Vneg in response to the enable signal 544 (en[i]) going high. Therefore, when the input enable signal 544 provided to a particular negative series switch 539 is high, the corresponding input global word line (GWl_pre[[i]) is not connected to the corresponding output global word line (GWl[i]). However, when the input enable signal 544 provided to the particular negative series switch 539 is low, the corresponding input global word line (GWl_pre[[i]) is connected to the corresponding output global word line (GWl[i]).

As described in the embodiment illustrated in FIG. 4, a negative series switch system, e.g., negative series switch system 435 shown in FIG. 4, can include a number of negative series switches, e.g., 539. In this manner, a negative voltage, e.g., Vneg, can be applied to a selected output global word line, while the associated unselected output global word lines can be connected to the corresponding input global word lines, such that only the selected output global word line receives the target negative voltage signal, e.g., Vneg.

Figure 6:
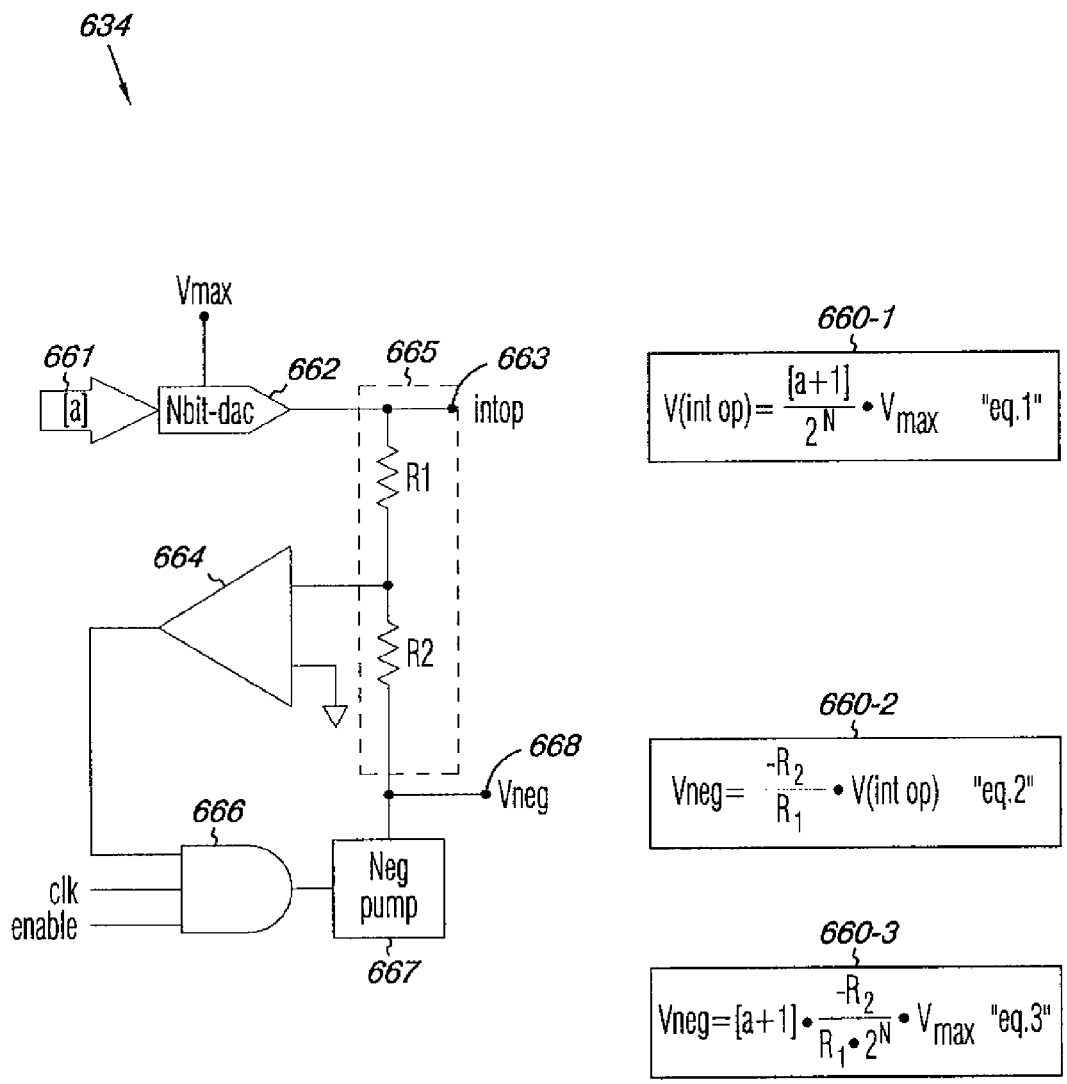
FIG. 6 illustrates a diagram of a negative voltage generator system in accordance with an embodiment of the present disclosure.

FIG. 6 illustrates a diagram of a negative voltage generator system 634 in accordance with one or more embodiments of the present disclosure. The negative voltage generator system 634 can be a negative voltage generator such as negative voltage generator 334 described in connection with FIG. 3B or a negative voltage generator 434 such as that described in connection with FIG. 4.

In the embodiment illustrated in FIG. 6, the negative voltage generator system 634 includes a negative charge pump 667. The negative charge pump can be various charge pumps known in the art. The system 634 includes a digital to analog converter 662 (Nbit-dac). The converter 662 is coupled to a supply voltage Vmax, which can have a voltage of about 1.5-2.0V, in one or more embodiments. The system 634 also includes a comparator 664 having a first input coupled to a resistor voltage divider 665 and a second input coupled to ground. In the embodiment illustrated in FIG. 6, the output of the comparator 664 is provided to an input of an AND gate 666, which also receives a clock signal (elk) and an enable signal (enable) as inputs. The enable signal (enable) provided to the negative voltage generator system 634 shown in FIG. 6 can be an enable signal such as Neg_enable signal 437 shown in FIG. 4, for example. The output of the AND gate 666 is coupled to the negative charge pump 667. As illustrated in FIG. 6, the charge pump 667 is connected to resistor R2 of the voltage divider 665 and the output of the digital to analog converter 662 is connected to resistor R1 of the voltage divider 665.

In operation, the output of the negative charge pump is stopped when a desired output voltage Vneg is reached, e.g., when the voltage at node 668 reaches Vneg. The desired output voltage Vneg can be a negative voltage to be applied to a selected word line of a memory array during a sensing operation, such as a read operation or a program verify operation as described herein above.

In the embodiment illustrated in FIG. 6, the digital to analog converter 662 provides an output voltage proportional to the value of a digital pattern 661 (shown as [a]). The converter 662 is an N-bit digital to analog converter where "N" can be a various numbers, e.g., the converter 662 is not limited to a particular number of bits. The output voltage of the digital converter 662 is provided at node 663 (intop) and can have a value given by example equation 660-1 ("eq.1"), where V(intop) is the voltage at node 663.

Since the current through R1 is the same as the current through R2, the voltage at node 668, e.g., Vneg, is given by example equation 660-2 ("eq.2"). As such, example equation 660-3 ("eq.3") can be obtained by combining equations 660-1 and 660-2 to provide a value for Vneg which depends on the digital pattern 661 provided to the converter 662, the resistance values R1 and R2 of the voltage divider 665, the supply voltage Vmax, and on the value of "N" of the converter 662.

The voltage signal Vneg output from the negative voltage generator system 634 can be provided to one or more negative series switches within a negative series switch system such as system 435 described in connection with FIG. 4 or system 335 described in connection with FIG. 3B. As described herein, the output voltage Vneg can be applied to a local word line of a memory array in order to perform sensing operations such as reading memory cells having negative threshold voltages, e.g., non-volatile memory cells having negative program states.

Figure 7:
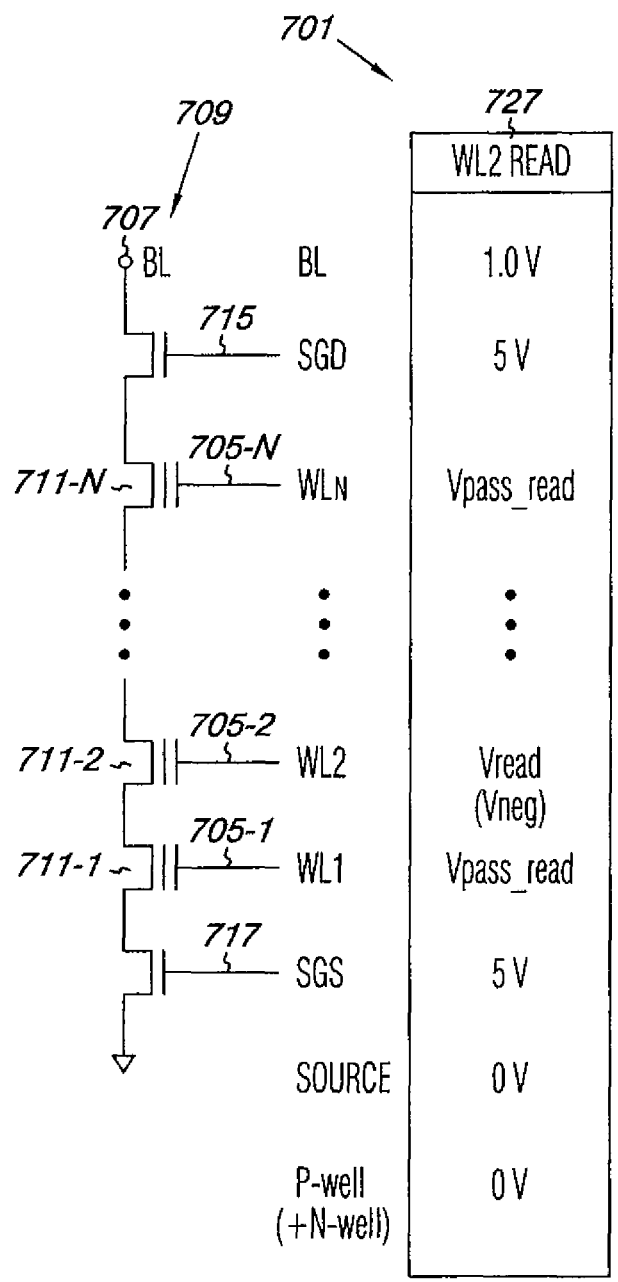
FIG. 7 illustrates a table showing operating voltages associated with sensing a memory cell according to an embodiment of the present disclosure.

FIG. 7 illustrates a table 701 showing operating voltages associated with sensing a memory cell according to an embodiment of the present disclosure. Table 701 illustrates operating voltages, e.g., bias conditions, associated with performing a read operation 727 (WL2 READ) on one or more memory cells coupled to a selected local word line, e.g., word line 705-2 (WL2) in this example. As discussed above, a selected local word line such as 705-2, can be a word line within a selected block of a memory array such as a NAND flash memory array, among various other types of memory arrays. The embodiment illustrated in FIG. 7 includes a NAND string 709 of multilevel memory cells, e.g., 711-1, 711-2, ..., 711-N, such as described in FIG. 1. As such, the cells 711-1, 711-2, ..., 711-N are coupled in series source to drain to a bit line (BL) 707, between a drain select line 715 and a source select line 717.

As shown in table 701, performing the read operation 727 on memory cell 711-2 coupled to selected word line 705-2 includes applying a read reference voltage (Vread), e.g., RD1, RD2, RD3, RD4, ..., RDN shown in FIG. 3A, to the selected word line 705-2. As discussed above and as shown in FIG. 7, in one or more embodiments, the read reference voltage (Vread) can be a negative voltage, e.g., Vneg. The negative voltage, e.g., Vneg, can be provided to the selected word line being read, e.g., 705-2 in this example, via a negative series switch system such as that described in connection with FIGS. 3B, 4, 5, and 6.

In various embodiments, the read operation 727 includes applying a pass through voltage (Vpass_read as shown) to unselected word lines, e.g., 705-1 and 705-3 to 705-N, such that unselected cells in string 709 operate in a conducting mode, e.g., the unselected cells in string 709 are turned on and pass current without regard to the Vt level of the unselected cells.

In the example illustrated in table 701, the unselected word lines, e.g., the unselected ones word lines 705-1 through 705-N, are biased at pass through voltage Vpass_read during the read operation 727. As an example, the Vpass_read voltage can be about 4.5 to 5.0V, but embodiments are not limited to a particular pass through voltage.

In the example shown in table 701, the read operation 727 includes biasing the bit line 707 (BL) at 1.0V, biasing the common source line (SOURCE) at 0V, and biasing a well region (P-well) associated with the string 709 at 0V. As one of ordinary skill in the art will appreciate, the bit line 707 can be precharged to 1.0V in a read operation.

In this example, drain select line 715 and the source select line 717 are biased at a voltage, e.g., 5V, which is sufficient to turn on the respective drain select gate (SGD) and source select gate (SGS) transistors. Under the biasing conditions shown in table 701, voltage and/or current levels on bit line 707 in response to the particular applied read reference voltage Vread, can be sensed by sensing circuitry (not shown) in order to determine a particular state, e.g., state 322-1, 322-2, 322-3, 322-4, ..., 322-N shown in FIG. 3A, of the selected memory cell 705-2.

Since various embodiments of the present disclosure can provide a negative read voltage, e.g., Vneg, to a selected word line, the states of memory cells having negative Vt levels can be determined. As such, various embodiments of the present disclosure can extend the usable programming window associated with an array of memory cells, e.g., by allowing memory cells programmed to either positive or negative Vt levels to be read and program verified.

Embodiments of the present disclosure are not limited to the example voltages shown in table 701. For instance, embodiments of the present disclosure are not limited to read operations in which the bit line 707 (BL) is biased at 1.0V and in which the common source line (SOURCE) and the well region (P-well) are biased at 0V, e.g., a ground voltage.

Figure 8:
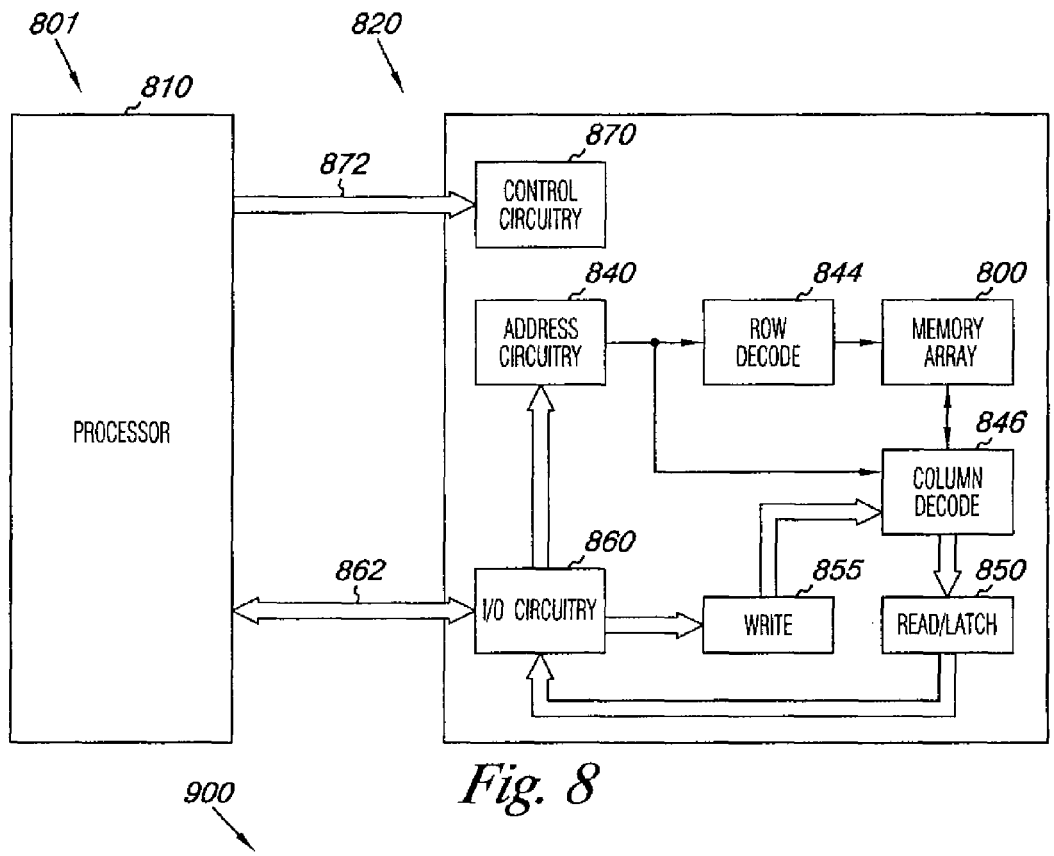
FIG. 8 is a functional block diagram of an electronic memory system having at least one memory device in accordance with an embodiment of the present disclosure.

FIG. 8 is a functional block diagram of an electronic memory system 801 having at least one memory device 820 in accordance with an embodiment of the present disclosure. Memory system 801 includes a processor 810 coupled to a non-volatile memory device 820 that includes a memory array 800 of non-volatile memory cells. The memory array 800 can be an array such as array 100 described in connection with FIG. 1. The memory system 801 can include separate integrated circuits or both the processor 810 and the memory device 820 can be on the same integrated circuit. The processor 810 can be a microprocessor or some other type of controlling circuitry such as an application-specific integrated circuit (ASIC).

The memory device 820 includes an array 800 of non-volatile memory cells, which can be floating gate flash memory cells with a NAND architecture. The control gates of each row of memory cells are coupled with a word line, while the drain regions of the memory cells are coupled to bit lines. The source regions of the memory cells are coupled to source lines, as the same has been illustrated in FIG. 1. As will be appreciated by those of ordinary skill in the art, the manner of connection of the memory cells to the bit lines and source lines depends on whether the array is a NAND architecture, a NOR architecture, and AND architecture, or some other memory array architecture.

The embodiment of FIG. 8 includes address circuitry 840 to latch address signals provided over I/O connections 862 through I/O circuitry 860. Address signals are received and decoded by a row decoder 844 and a column decoder 846 to access the memory array 800. In light of the present disclosure, it will be appreciated by those skilled in the art that the number of address input connections depends on the density and architecture of the memory array 800 and that the number of addresses increases with both increased numbers of memory cells and increased numbers of memory blocks and arrays.

The memory device 820 reads data in the memory array 800 by sensing voltage and/or current changes in the memory array columns using sense/buffer circuitry that in this embodiment can be read/latch circuitry 850. According to one or more embodiments, the read/latch circuitry 850 can include a negative series switch system such as that described in connection with FIG. 3B. However, as one of ordinary skill in the art will appreciate, a negative series switch system according to one or more embodiments of the present disclosure can be located within one or more other components of the memory device 820 or may be a separate component of the memory device 820. The read/latch circuitry 850 can read and latch a page or row of data from the memory array 800. I/O circuitry 860 is included for bi-directional data communication over the I/O connections 862 with the processor 810. Write circuitry 855 is included to write data to the memory array 800.

Control circuitry 870 decodes signals provided by control connections 872 from the processor 810. These signals can include chip signals, write enable signals, and address latch signals that are used to control the operations on the memory array 800, including data read, data write, and data erase operations. In various embodiments, the control circuitry 870 is responsible for executing instructions from the processor 810 to perform the operating embodiments of the present disclosure. The control circuitry 870 can be a state machine, a sequencer, or some other type of controller. It will be appreciated by those skilled in the art that additional circuitry and control signals can be provided, and that the memory device detail of FIG. 8 has been reduced to facilitate ease of illustration.

Figure 9:
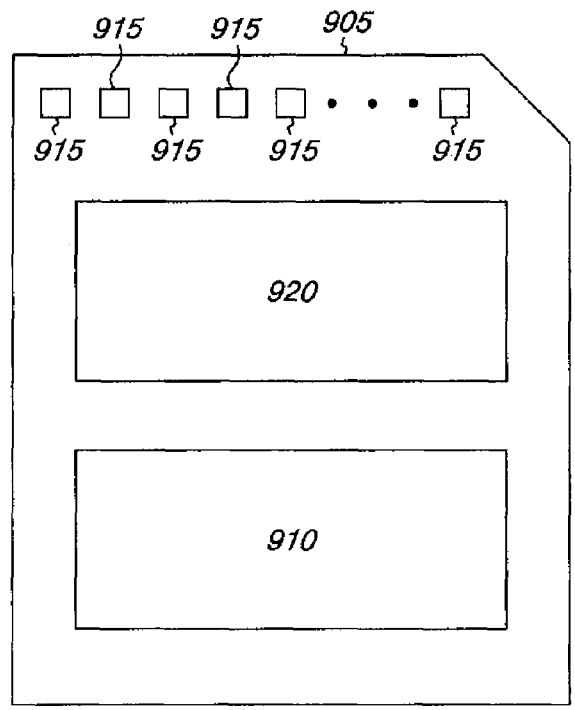
FIG. 9 is a functional block diagram of a memory module having at least one memory device in accordance with an embodiment of the present disclosure.

FIG. 9 is a functional block diagram of a memory module 900 having at least one memory device in accordance with an embodiment of the present disclosure, e.g., at least one memory device that includes a negative series switch system such as that described in connection with FIG. 3B. Memory module 900 is illustrated as a memory card, although the concepts discussed with reference to memory module 900 are applicable to other types of removable or portable memory (e.g., USB flash drives) and are intended to be within the scope of "memory module" as used herein. In addition, although one example form factor is depicted in FIG. 9, these concepts are applicable to other form factors as well.

In some embodiments, memory module 900 will include a housing 905 (as depicted) to enclose one or more memory devices 910, though such a housing is not essential to all devices or device applications. At least one memory device 910 includes an array of non-volatile multilevel memory cells that includes memory cells that can be operated, e.g., programmed, erased, and/or read, according to embodiments described herein. Where present, the housing 905 includes one or more contacts 915 for communication with a host device. Examples of host devices include digital cameras, digital recording and playback devices, PDAs, personal computers, memory card readers, interface hubs and the like. For some embodiments, the contacts 915 are in the form of a standardized interface. For example, with a USB flash drive, the contacts 915 might be in the form of a USB Type-A male connector. For some embodiments, the contacts 915 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 915 provide an interface for passing control, address and/or data signals between the memory module 900 and a host having compatible receptors for the contacts 915.

The memory module 900 may optionally include additional circuitry 920, which may be one or more integrated circuits and/or discrete components. For some embodiments, the additional circuitry 920 may include control circuitry, such as a memory controller, for controlling access across multiple memory devices 910 and/or for providing a translation layer between an external host and a memory device 910. For example, there may not be a one-to-one correspondence between the number of contacts 915 and a number of 910 connections to the one or more memory devices 910. Thus, a memory controller could selectively couple an I/O connection (not shown in FIG. 9) of a memory device 910 to receive the appropriate signal at the appropriate I/O connection at the appropriate time or to provide the appropriate signal at the appropriate contact 915 at the appropriate time. Similarly, the communication protocol between a host and the memory module 900 may be different than what is required for access of a memory device 910. A memory controller could then translate the command sequences received from a host into the appropriate command sequences to achieve the desired access to the memory device 910. Such translation may further include changes in signal voltage levels in addition to command sequences.

The additional circuitry 920 may further include functionality unrelated to control of a memory device 910 such as logic functions as might be performed by an ASIC. Also, the additional circuitry 920 may include circuitry to restrict read or write access to the memory module 900, such as password protection, biometrics or the like. The additional circuitry 920 may include circuitry to indicate a status of the memory module 900. For example, the additional circuitry 920 may include functionality to determine whether power is being supplied to the memory module 900 and whether the memory module 900 is currently being accessed, and to display an indication of its status, such as a solid light while powered and a flashing light while being accessed. The additional circuitry 920 may further include passive devices, such as decoupling capacitors to help regulate power requirements within the memory module 900.

CONCLUSION

Methods, devices, modules, and systems for memory cell sensing using negative voltage have been described herein. One method includes applying a negative read voltage to a selected word line of an array of memory cells, applying a pass voltage to a number of unselected word lines of the array, and sensing whether a cell coupled to the selected word line is in a conductive state in response to the applied negative read voltage.

Although specific embodiments have been illustrated and described herein, those ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for sensing an array of memory cells, the method comprising:
applying a negative read voltage to a selected local access line of the array through a global access line switch system;
applying a pass voltage to a number of unselected access lines of the array through the global access line switch system; and
sensing whether a cell coupled to the selected local access line is in a conductive state in response to the applied negative read voltage.

2. The method of claim 1, wherein the array is a NAND array of non-volatile multilevel memory cells, and wherein the method includes applying the pass voltage to each of a number of unselected cells in a particular string of the NAND array.

3. The method of claim 2, wherein the method includes applying the negative read voltage to the selected access line during a program verify operation.

4. The method of claim 1, wherein the method includes programming the cell coupled to the selected local access line such that a threshold voltage (Vt) level of the corresponds to one of a number of program states corresponding to negative Vt levels.

5. The method of claim 1, wherein the global access line switch system is directly coupled to a number of input global access lines and a corresponding number of output global access lines associated with the array.

6. The method of claim 5, wherein the global access line switch system is configured to provide the negative read voltage to the selected local access line through the corresponding output global access line to which the selected local access line is coupled.

7. A method for sensing multilevel memory cells, the method comprising:
applying a negative read voltage to a local access line of a selected cell while applying a pass voltage to local access lines of unselected cells, wherein the selected cell and unselected cells are associated with a number of different program states, wherein at least two of the different program states correspond to negative Vt levels;
providing the pass voltage to the local access lines of the unselected cells through a global access line switch system;
providing the negative read voltage to the local access line of the selected cell through the global access line switch system;
wherein the global access line switch system is coupled to a number of input global access lines and a corresponding number of output global access lines; and
sensing a current variation of a data line in response to the selected cell changing from a non-conducting state to a conducting state.

8. The method of claim 7, wherein the method includes applying a ground voltage to a common source line associated with the selected cell.

9. The method of claim 7, wherein the method includes determining a program state of the selected cell based at least partially on the sensing.

10. The method of claim 7, wherein the method includes, prior to applying the negative read voltage, programming the selected cell such that it has a Vt level corresponding to one of the at least two different program states corresponding to negative Vt levels.

11. The method of claim 10, wherein the method includes programming the selected cell from an erase state to the Vt level corresponding to one of the at least two different program states corresponding to negative Vt levels.

12. A method for sensing an array of memory cells, the method comprising:
applying a negative read voltage to a selected local access line of the array through a global access line switch system;
applying a pass voltage to a number of unselected local access lines of the array through the global access line switch system; and
sensing whether a cell coupled to the selected local access line is in a conductive state in response to the applied negative read voltage.

13. The method of claim 12, wherein the global access line switch system is connected to a number of input global access lines and to a corresponding number of output global access lines, and wherein the method includes applying the negative read voltage to a selected output global access line connected to the selected local access line.

14. The method of claim 13, wherein the method includes applying the negative read voltage to the selected output global access line in response to a particular state of an enable signal received by the global access line switch system.

15. The method of claim 13, wherein the method includes insulating an input global access line corresponding to the selected output global access line from the applied negative read voltage.

16. The method of claim 13, wherein the global access line switch system includes a number of series switches corresponding to the number of input global access lines and the number of output global access lines, and wherein the method includes providing an enable signal to each of the number of series switches.

17. The method of claim 16, wherein each of the number of switch circuits includes a level shifter, and wherein the method includes providing an enable input signal to the level shifter.

18. The method of claim 12, wherein the array is coupled to a bank of insulated string drive transistors and wherein the method includes providing the negative read voltage to the selected local access line through the bank of insulated string drive transistors.

19. The method of claim 12, including sensing whether the cell coupled to the selected local access line is in the conductive state in response to the applied negative read voltage via control circuitry coupled to the array.

20. The method of claim 12, wherein applying the negative read voltage to a selected local access line of the array through a global access line switch system includes applying the negative read voltage to a selected local access line of a NAND array.

* * * * *